United States Patent
Joish

(10) Patent No.: US 10,608,602 B2
(45) Date of Patent: Mar. 31, 2020

(54) PROGRAMMABLE FILTER IN AN AMPLIFIER

(71) Applicant: Texas Instruments Incorporated, Dallas, TX (US)

(72) Inventor: Rajendrakumar Joish, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/268,552

(22) Filed: Feb. 6, 2019

(65) Prior Publication Data

US 2019/0173437 A1   Jun. 6, 2019

Related U.S. Application Data

(63) Continuation of application No. 15/824,984, filed on Nov. 28, 2017, now Pat. No. 10,263,575, which is a (Continued)

(30) Foreign Application Priority Data

Sep. 16, 2014   (IN) .......................... 4513/CHE/2014

(51) Int. Cl.
| | | |
|---|---|---|
| H03F 3/68 | (2006.01) | |
| H03F 3/19 | (2006.01) | |
| H03F 1/02 | (2006.01) | |
| H03F 3/191 | (2006.01) | |
| H03F 3/45 | (2006.01) | |

(Continued)

(52) U.S. Cl.
CPC .............. *H03F 3/19* (2013.01); *H03F 1/0205* (2013.01); *H03F 3/191* (2013.01); *H03F 3/45098* (2013.01); *H03F 3/45103* (2013.01); *H03F 1/0277* (2013.01); *H03F 1/22* (2013.01); *H03F 1/223* (2013.01); *H03F 1/3211* (2013.01); *H03F 3/45* (2013.01); *H03F 2200/111* (2013.01); *H03F 2200/294* (2013.01); *H03F 2200/451* (2013.01); *H03F 2200/546* (2013.01); *H03F 2203/45296* (2013.01); *H03F 2203/45396* (2013.01)

(58) Field of Classification Search
CPC .......... H03F 3/19; H03F 1/0205; H03F 3/191; H03F 3/45103; H03F 3/45098; H03F 1/22; H03F 1/0277; H03F 1/223; H03F 1/3211; H03F 3/45; H03F 2203/45396; H03F 2203/45296; H03F 2200/546; H03F 2200/111; H03F 2200/451; H03F 2200/294
USPC ................................ 330/252, 253, 295, 311
See application file for complete search history.

(56) References Cited

U.S. PATENT DOCUMENTS

| | | |
|---|---|---|
| 6,292,060 B1 | 9/2001 | Yeo et al. |
| 7,956,682 B2 | 6/2011 | Hasegawa |

(Continued)

*Primary Examiner* — Khanh V Nguyen
(74) *Attorney, Agent, or Firm* — John R. Pessetto; Charles A. Brill; Frank D. Cimino

(57) ABSTRACT

The disclosure provides an amplifier. The amplifier includes a first transistor that receives a first input and generates a first load current. A first output node is coupled to a power supply through a first load resistor. The first load resistor receives the first load current. A first capacitor network is coupled to the first output node and draws a first capacitive current from the first output node. A first current buffer is coupled between the first output node and the first transistor. A current through the first current buffer is a summation of the first load current and the first capacitive current.

3 Claims, 7 Drawing Sheets

Figure 1:
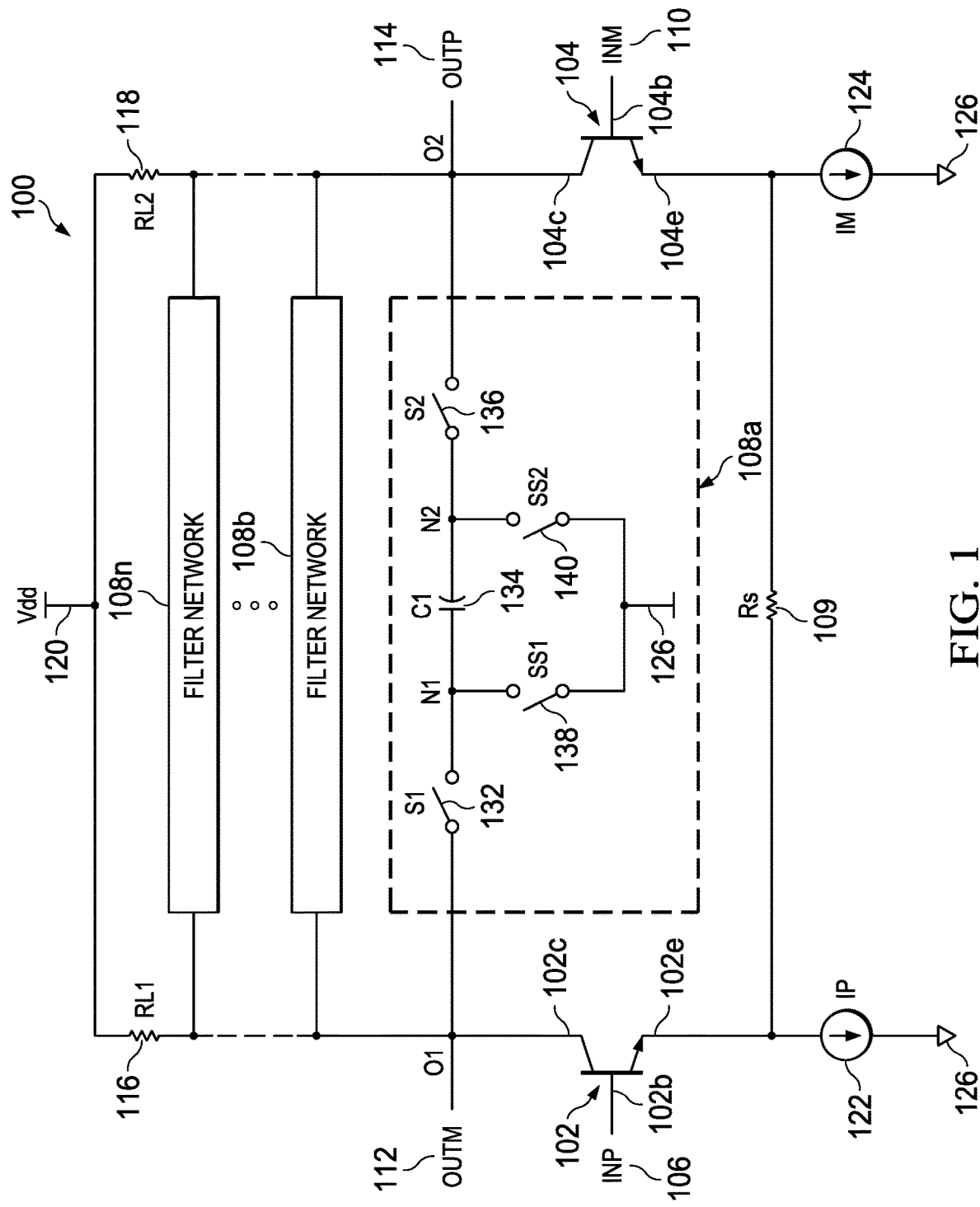

Related U.S. Application Data continuation of application No. 14/852,004, filed on Sep. 11, 2015, now abandoned.

(51) Int. Cl.
  *H03F 1/32* (2006.01)
  *H03F 1/22* (2006.01)

(56) References Cited

U.S. PATENT DOCUMENTS

| | | |
|---|---|---|
| 7,978,009 B2 | 7/2011 | Mu |
| 8,447,259 B2 | 5/2013 | Chang et al. |
| 2007/0001768 A1 | 1/2007 | Kim et al. |
| 2009/0102571 A1 | 4/2009 | Park et al. |

PROGRAMMABLE FILTER IN AN AMPLIFIER

CROSS REFERENCE TO RELATED APPLICATIONS

This continuation application claims priority to U.S. patent application Ser. No. 15/824,984, filed Nov. 28, 2017, which claims priority to U.S. patent application Ser. No. 14/852,004, filed Sep. 11, 2015, which claims priority to India provisional patent application No. 4513/CHE/2014 filed on Sep. 16, 2014, all of which are hereby incorporated herein by reference in their entirety.

TECHNICAL FIELD

The present disclosure is generally related to amplifiers, and more particularly to use of low noise amplifiers for signal processing applications such as optical time domain reflectometry (OTDR).

BACKGROUND

An amplifier is utilized in various applications of remote sensing and communication equipment. Applications of the amplifier include radar, ultrasound, wireless communication and even speech analysis. These applications use the amplifier to enhance dynamic performance. An amplifier is categorized as low noise amplifier (LNA), variable gain amplifier (VGA) and programmable gain amplifier (PGA). Each of these amplifiers is used to sense and amplify low level signals.

The low noise amplifiers (LNAs) are used in receivers to amplify radio frequency (RF) signals received by a receive antenna. LNAs which are required to present a high input impedance have a V2I (voltage to current) architecture followed by an I2V (current to voltage) architecture. A bandwidth programmability of the LNA is incorporated into the I2V architecture.

The I2V architecture includes load resistors, a set of switches and a set of capacitors. When the LNA is used in a differential mode, the set of switches used in the I2V architecture invariably see a large voltage swing which degrades linearity of the LNA. In addition, the unused capacitors in the set of capacitors have to be biased to a voltage through a large resistor which introduces slow settling components in the LNA.

SUMMARY

According to an aspect of the disclosure, an amplifier is disclosed. The amplifier includes a first transistor that receives a first input and generates a first load current. A first output node is coupled to a power supply through a first load resistor. The first load resistor receives the first load current. A first capacitor network is coupled to the first output node and draws a first capacitive current from the first output node. A first current buffer is coupled between the first output node and the first transistor. A current through the first current buffer is a summation of the first load current and the first capacitive current.

BRIEF DESCRIPTION OF THE VIEWS OF DRAWINGS

Figure 2:
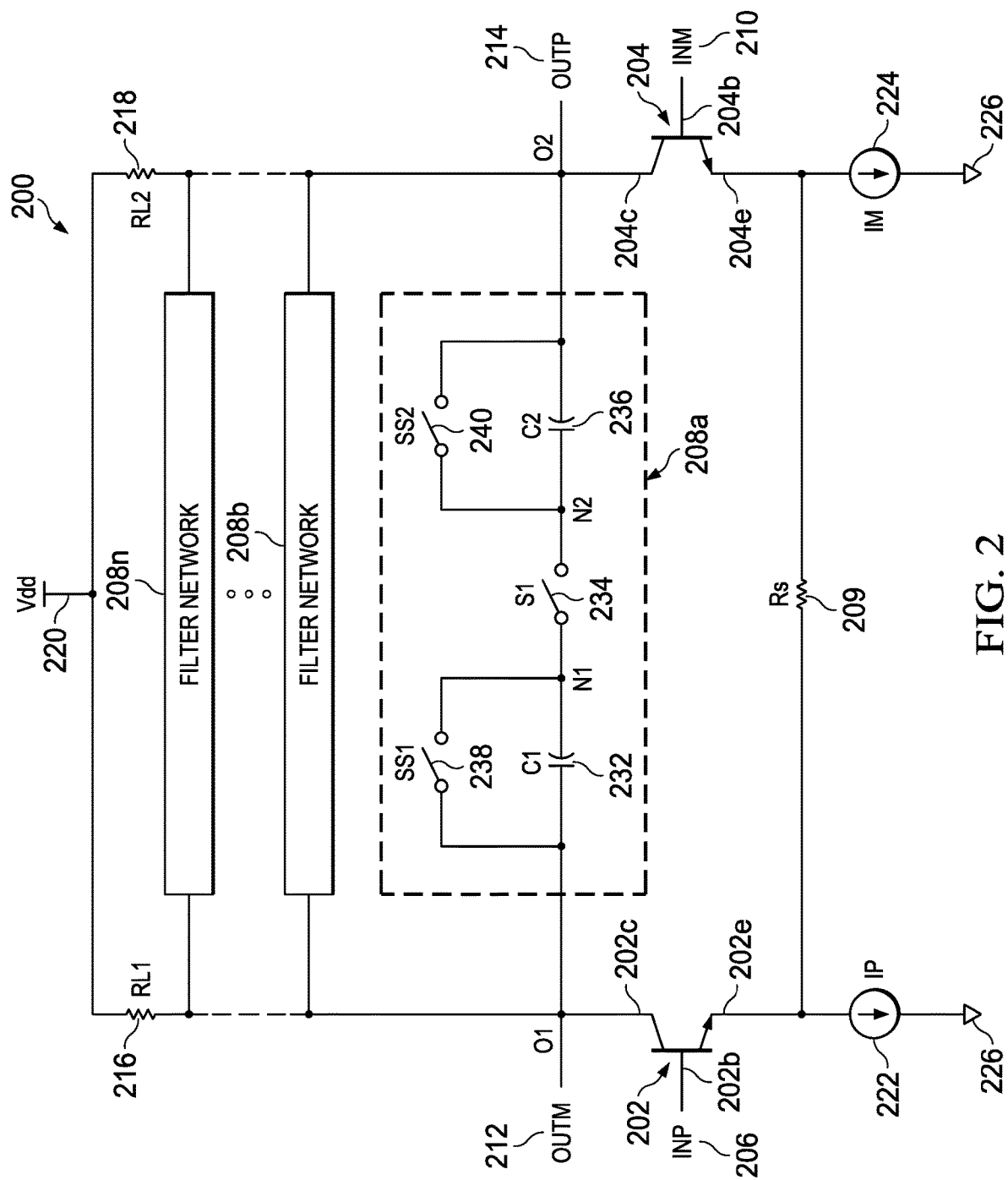
Figure 3:
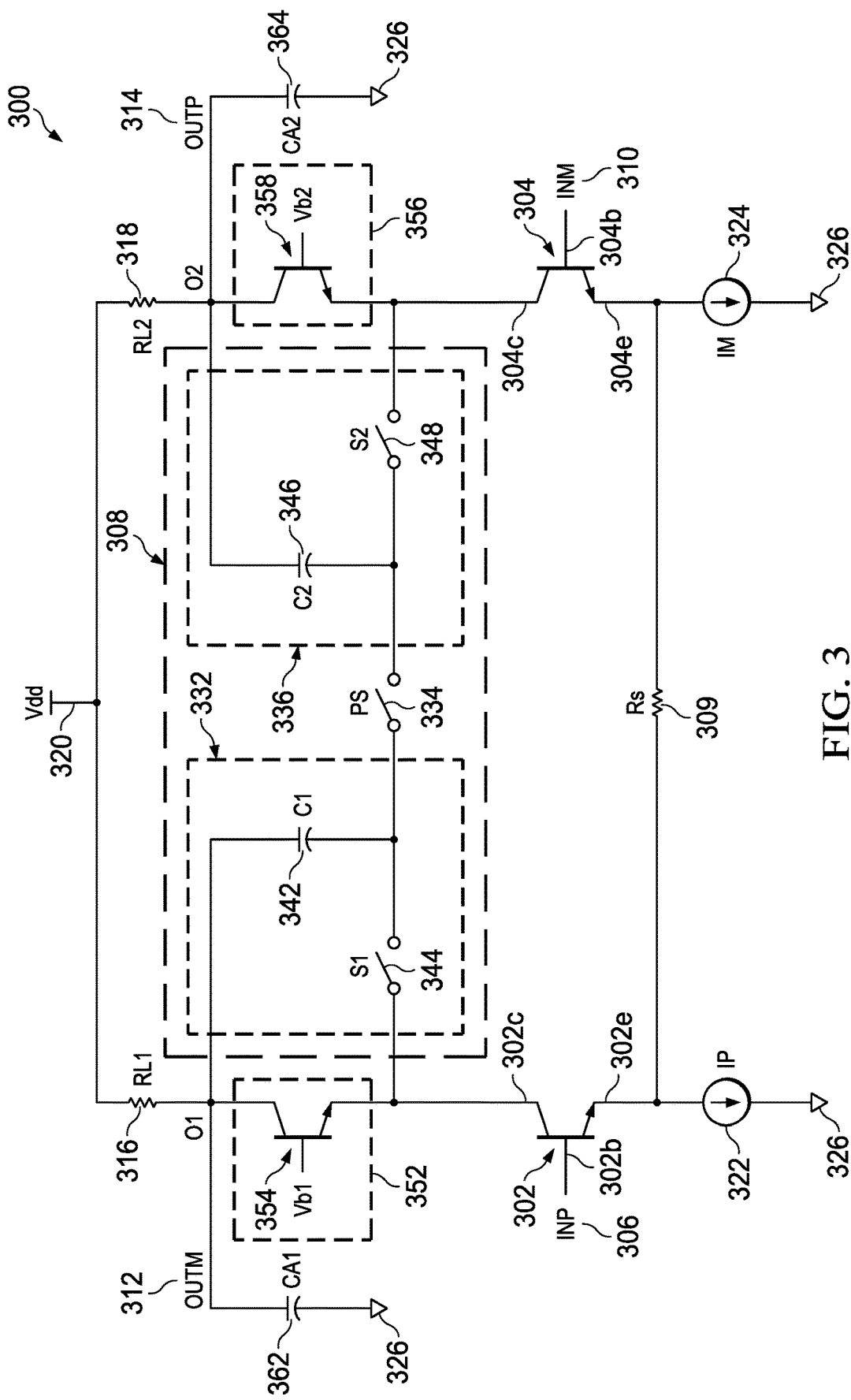
Figure 4:
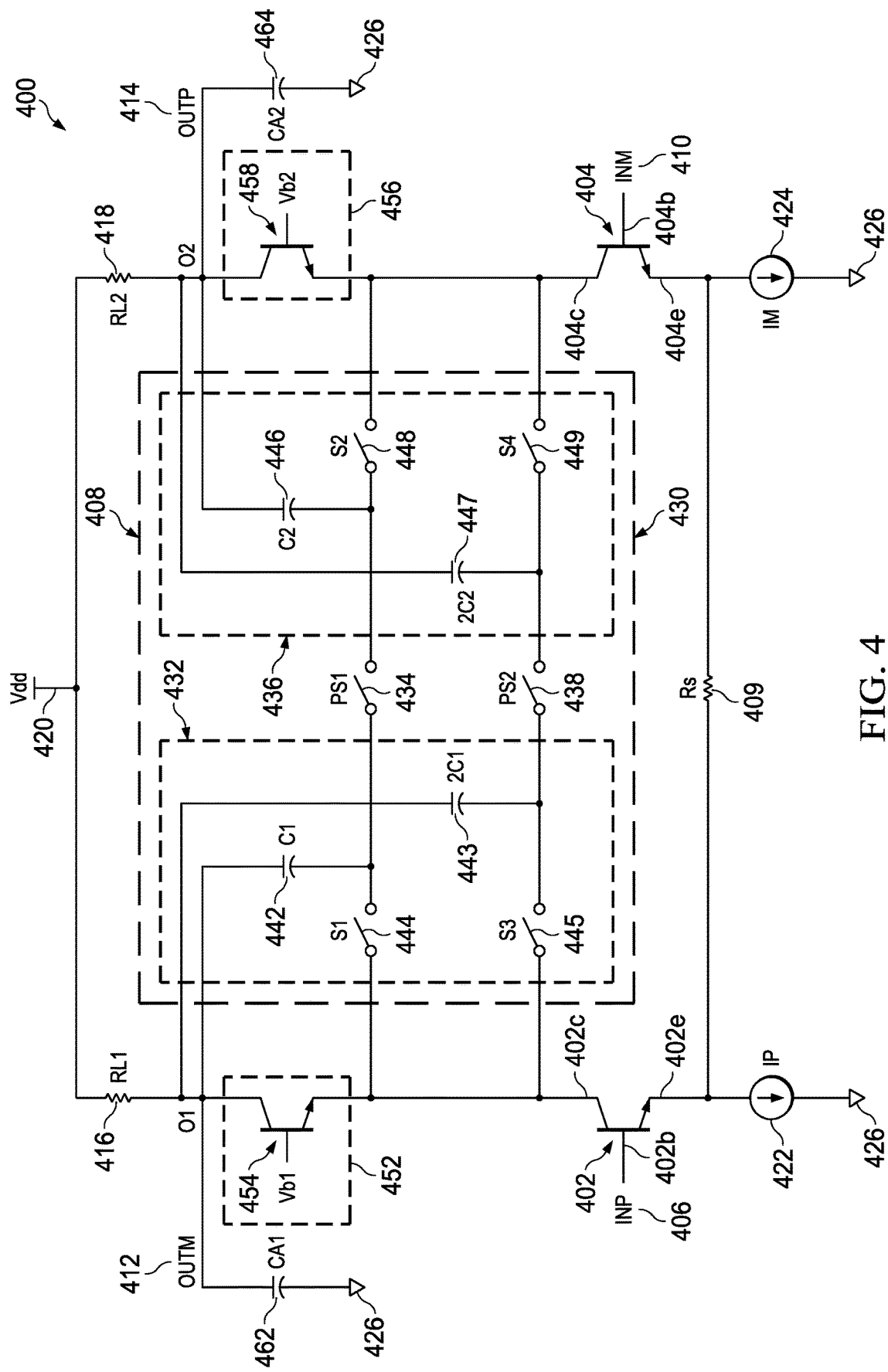
Figure 5:
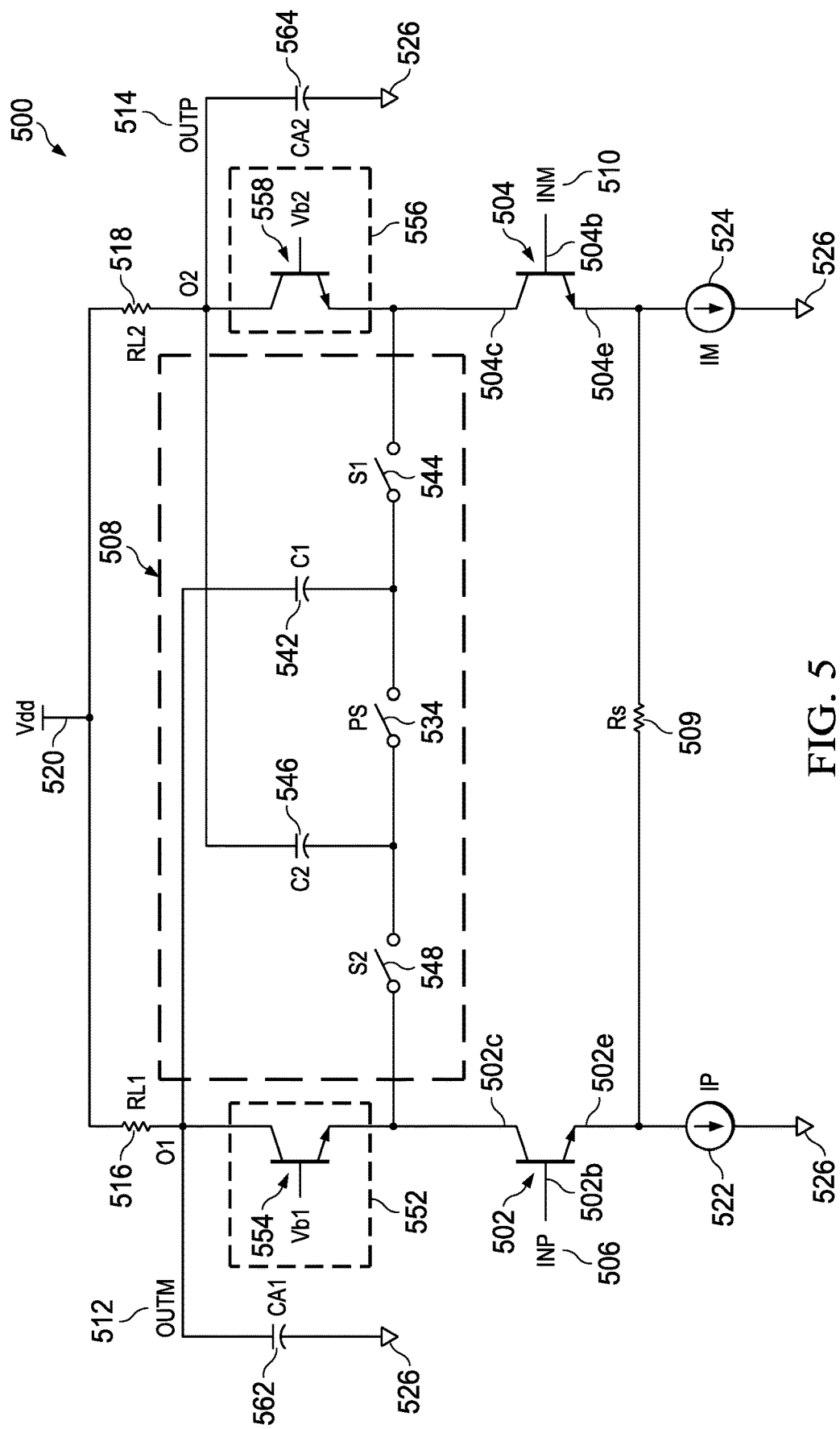
Figure 6:
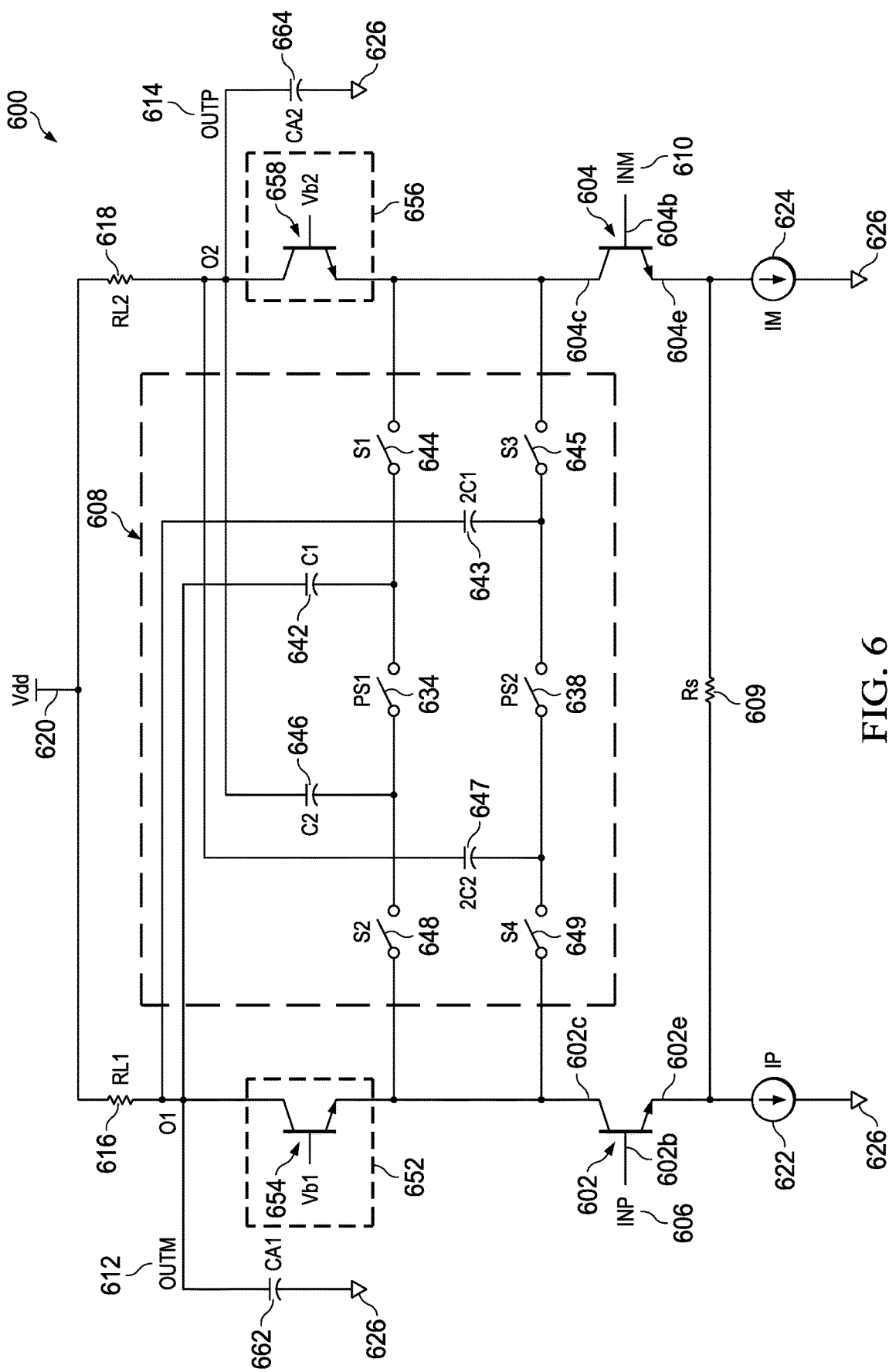
Figure 7:
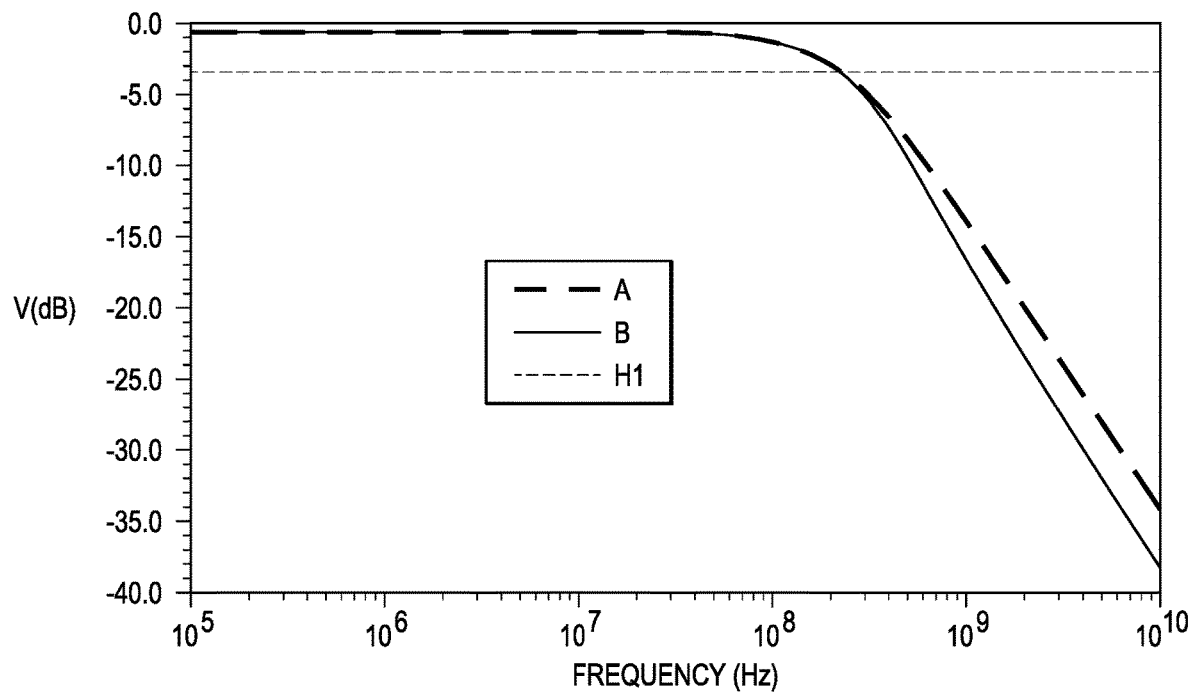
Figure 8:
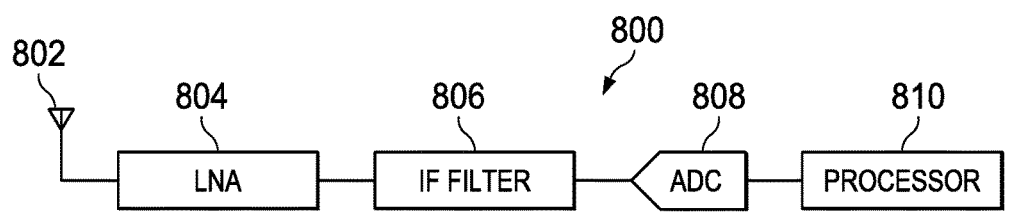

FIG. 1 illustrates an amplifier;
FIG. 2 illustrates an amplifier;
FIG. 3 illustrates an amplifier, according to an embodiment;
FIG. 4 illustrates an amplifier, according to an embodiment;
FIG. 5 illustrates an amplifier, according to an embodiment;
FIG. 6 illustrates an amplifier, according to an embodiment;
FIG. 7 is a graph illustrating frequency response of an amplifier, according to an embodiment; and
FIG. 8 is a block diagram illustrating an example receiver in which several aspects of the present invention can be implemented.

DETAILED DESCRIPTION OF THE EMBODIMENTS

FIG. 1 illustrates an amplifier 100. The amplifier 100, in one example, is a low noise amplifier. The amplifier 100 includes a first transistor 102 and a second transistor 104. The first transistor 102 receives a first input INP 106, and the second transistor 104 receives a second input INM 110.

The first transistor 102 is an NPN transistor whose base terminal 102b receives the first input INP 106, and whose emitter terminal 102e is coupled to a first biasing current source IP 122. A collector terminal 102c of the first transistor 102 is coupled to a power supply Vdd 120 through a first load resistor RL1 116. The first biasing current source IP 122 is coupled between the emitter terminal 102e of the first transistor 102 and a ground terminal 126.

The second transistor 104 is an NPN transistor whose base terminal 104b receives the second input INM 110 and whose emitter terminal 104e is coupled to a second biasing current source IM 124. A collector terminal 104c of the second transistor 104 is coupled to the power supply Vdd 120 through a second load resistor RL2 118. The second biasing current source IM 124 is coupled between the emitter terminal 104e of the second transistor 104 and the ground terminal 126.

A first output node O1 is coupled between the first load resistor RL1 116 and the collector terminal 102c of the first transistor 102. A second output node O2 is coupled between the second load resistor RL2 118 and the collector terminal 104c of the second transistor 104. A first output OUTM 112 is generated at the first output node O1, and a second output OUTP 114 is generated at the second output node O2. An impedance Rs 109 is coupled between the emitter terminal 102e of the first transistor 102 and the emitter terminal 104e of the second transistor 104.

The amplifier 100 includes a plurality of filter networks represented as 108a, 108b to 108n. The plurality of filter networks is coupled between the first output node O1 and the second output node O2. The plurality of filter networks 108a, 108b, to 108n is similar in connection and operation. For the sake of brevity of the description, the connection and operation of the filter network 108a is described in detail. The filter network 108a includes a first switch S1 132, a first capacitor C1 134 and a second switch S2 136.

The first switch S1 132 is coupled between the first output node O1 and a first node N1. The first capacitor C1 134 is coupled between the first node N1 and a second node N2. The second switch S2 136 is coupled between the second node N2 and the second output node O2. A first shorting switch SS1 138 is coupled between the first node N1 and the ground terminal 126. A second shorting switch SS2 140 is coupled between the second node N2 and the ground terminal 126.

The first load resistor RL1 116 and the second load resistor RL2 118 together with the plurality of filter networks form an I2V (current to voltage) architecture of the amplifier 100. The first transistor 102, the second transistor 104 and the impedance Rs 109 form a V2I (voltage to current) architecture.

A bandwidth of the amplifier 100 is inversely proportional to a product of a resistance of the first load resistor RL1 116 and a capacitance of the plurality of filter networks. The bandwidth programmability of the amplifier 100 is incorporated into the I2V architecture, and it is programmed by changing the capacitance of the plurality of filter networks. The capacitance of the plurality of filter networks is changed by activating one or more filter networks.

The operation of the amplifier 100 illustrated in FIG. 1 is explained now. In one example, the first input INP 106 and the second input INM 110 are biased to a common voltage. The amplifier 100 is capable of single ended operation and differential operation. During the single ended operation, the first input INP 106 is greater than the second input INM 110. For example, the first input INP 106 is at a defined voltage level above common mode voltage, and the second input INM 110 is at common mode voltage. During the differential operation, the first input INP 106 and the second input INM 110 are differential signals. For example, the first input INP 106 is at V/2 and the second input INM 110 is at −V/2, where V is a voltage level.

Each of the first switch S1 132 and the second switch S2 136 is a MOS transistor. When activated, each of these switches has an ON switch resistance (Rsw). Each of these switches has an associated switch capacitance (Csw). A swing in a voltage across the filter network 108a causes variations in the ON switch resistance (Rsw) and switch capacitance (Csw). This variation in the ON switch resistance (Rsw) results in a distorted voltage across the switch. For example, when the switch is a MOS transistor, a swing across the switch is at least one of swing across source-drain terminal, swing across gate-source terminal and swing across gate-drain terminal. A linearity degradation of a switch due to variation of the ON switch resistance (Rsw) causes much more distortion than the variation of the switch capacitance (Csw) at low frequencies.

During the differential operation, the first input INP 106 is at V/2 and the second input INM 110 is at −V/2, where V is a voltage level. In differential operation, when both the first switch S1 132 and the second switch S2 136 are activated, it causes a voltage swing across both the first switch S1 132 and the second switch S2 136. This voltage swing across the first switch S1 132 and the second switch S2 136 results in the ON switch resistance (Rsw) and switch capacitance (Csw) non-linearites. This degrades the performance of the amplifier 100.

The first switch S1 132 and the second switch S2 136 require bootstrapping both in differential operation and in single ended operation. Bootstrapping is driving a gate terminal of the MOS transistor to track the voltage swing. Bootstrapping requires an additional power source, and a complex circuit to support these switches. The size of the switches used in amplifier 100 is large. Thus, amplifier 100 has multiple drawbacks when both the first switch S1 132 and the second switch S2 136 are activated.

In differential operation, when both the first switch S1 132 and the second switch S2 136 are inactivated, the terminals of the first capacitor C1 134 are floating, and hence are required to be biased. Therefore, the first shorting switch SS1 138 and the second shorting switch SS2 140 are activated. This shorts the first capacitor C1 134 to the ground terminal 126. In one example, the first capacitor C1 134 is biased to a bias voltage i.e. the first shorting switch SS1 138 and the second shorting switch SS2 140 couple the first capacitor C1 134 to the bias voltage. A width and length of the MOS transistors used for the first shorting switch SS1 138 and the second shorting switch SS2 140 are small. Also, a bulk terminal of each of the first switch S1 132 and the second switch S2 136 is bootstrapped. Since, the first switch S1 132 and the second switch S2 136 are inactivated, a non-linearity due to the ON switch resistance (Rsw) does not exist and a non-linearity due to the switch capacitance (Csw) is negligible at low frequencies. Hence, this does not degrade the performance of the amplifier 100.

FIG. 2 illustrates an amplifier 200. The amplifier 200, in one example, is a low noise amplifier. The amplifier 200 includes a first transistor 202 and a second transistor 204. The first transistor 202 receives a first input INP 206, and the second transistor 204 receives a second input INM 210.

The first transistor 202 is an NPN transistor whose base terminal 202b receives the first input INP 206, and whose emitter terminal 202e is coupled to a first biasing current source IP 222. A collector terminal 202c of the first transistor 202 is coupled to a power supply Vdd 220 through a first load resistor RL1 216. The first biasing current source IP 222 is coupled between the emitter terminal 202e of the first transistor 202 and a ground terminal 226.

The second transistor 204 is an NPN transistor whose base terminal 204b receives the second input INM 210 and whose emitter terminal 204e is coupled to a second biasing current source IM 224. A collector terminal 204c of the second transistor 204 is coupled to the power supply Vdd 220 through a second load resistor RL2 218. The second biasing current source IM 224 is coupled between the emitter terminal 204e of the second transistor 204 and the ground terminal 226.

A first output node O1 is coupled between the first load resistor RL1 216 and the collector terminal 202c of the first transistor 202. A second output node O2 is coupled between the second load resistor RL2 218 and the collector terminal 204c of the second transistor 204. A first output OUTM 212 is generated at the first output node O1, and a second output OUTP 214 is generated at the second output node O2. An impedance Rs 209 is coupled between the emitter terminal 202e of the first transistor 202 and the emitter terminal 204e of the second transistor 204.

The amplifier 200 includes a plurality of filter networks represented as 208a, 208b to 208n. The plurality of filter networks is coupled between the first output node O1 and the second output node O2. The plurality of filter networks 208a, 208b, to 208n are similar in connection and operation. For the sake of brevity of the description, the connection and operation of the filter network 208a is described in detail. The filter network 208a includes a first capacitor C1 232, a first switch S1 234 and a second capacitor C2 236.

The first capacitor C1 232 is coupled between the first output node O1 and a first node N1. The first switch S1 234 is coupled between the first node N1 and a second node N2. The second capacitor C2 236 is coupled between the second node N2 and the second output node O2. A first shorting switch SS1 238 is coupled in parallel to the first capacitor C1 232. The first shorting switch SS1 238 is coupled between the first output node O1 and the first node N1. A second shorting switch SS2 240 is coupled in parallel to the second capacitor C2 236. The second shorting switch SS2 240 is coupled between the second node N2 and the second output node O2.

The first load resistor RL1 216 and the second load resistor RL2 218 together with the plurality of filter networks form an I2V (current to voltage) architecture of the amplifier 200. The first transistor 202, the second transistor 204 and the impedance Rs 209 form a V2I (voltage to current) architecture.

A bandwidth of the amplifier 200 is inversely proportional to a product of a resistance of the first load resistor RL1 216 and a capacitance of the plurality of filter networks. The bandwidth programmability of the amplifier 200 is incorporated into the I2V architecture, and it is programmed by changing the capacitance of the plurality of filter networks. The capacitance of the plurality of filter networks is changed by activating one or more filter networks.

The operation of the amplifier 200 illustrated in FIG. 2 is explained now. In one example, the first input INP 206 and the second input INM 210 are biased to a common voltage. The amplifier 200 is capable of single ended operation and differential operation. During the single ended operation, the first input INP 206 is greater than the second input INM 210. For example, the first input INP 206 is at a defined voltage level above common mode voltage, and the second input INM 210 is at common mode voltage. During the differential operation, the first input INP 206 and the second input INM 210 are differential signals. For example, the first input INP 206 is at V/2 and the second input INM 210 is at −V/2, where V is a voltage level.

Each of the first switch S1 234, the first shorting switch SS1 238 and the second shorting switch SS2 240 is a MOS transistor. When activated, each of these switches has an ON switch resistance (Rsw). Each of these switches has an associated switch capacitance (Csw). A swing in a voltage across the filter network 208a causes variations in the ON switch resistance (Rsw) and switch capacitance (Csw). This variation in the ON switch resistance (Rsw) results in a distorted voltage across the switch. For example, when the switch is a MOS transistor, a swing across the switch is at least one of swing across source-drain terminal, swing across gate-source terminal and swing across gate-drain terminal. A linearity degradation of a switch due to variation of the ON switch resistance (Rsw) is much more dominant than the variation of the switch capacitance (Csw) at low frequencies.

During the differential operation, the first input INP 206 is at V/2 and the second input INM 210 is at −V/2, where V is a voltage level. In differential operation, when the first switch S1 234 is activated and the first shorting switch SS1 238 and the second shorting switch SS2 240 are inactivated, a swing at the first node N1 and the second node N2 is 0 volt. Hence, it does not cause the ON switch resistance (Rsw) and switch capacitance (Csw) non-linearites. Also, the first switch S1 234 does not require bootstrapping.

In differential operation, when the first switch S1 234 is inactivated, the first node N1 and the second node N2 are floating, and hence are required to be biased. When large resistors are used for biasing these nodes, it results in a slow settling component with time constant proportional to a product of a resistance of biasing resistors and a capacitance at the first node N1 and the second node N2.

To bias the first node N1 and the second node N2, the first shorting switch SS1 238 and the second shorting switch SS2 240 are used respectively. The first switch S1 234 is inactivated and the first shorting switch SS1 238 and the second shorting switch SS2 240 are activated. A voltage swing across the first switch S1 234 causes the ON switch resistance (Rsw) variations in the first shorting switch SS1 238 and the second shorting switch SS2 240. This causes a distorted voltage across the switch S1 234, the first shorting switch SS1 238 and the second shorting switch SS2 240. Hence, this degrades the performance of the amplifier 200. In addition, bootstrapping is required for the first shorting switch SS1 238 and the second shorting switch SS2 240.

Bootstrapping is driving a gate terminal of the MOS transistor to track the voltage swing. Bootstrapping requires an additional power source, and a complex circuit to support these switches. Thus, amplifier 200 has multiple drawbacks when the first switch S1 234 is inactivated during differential operation.

FIG. 3 illustrates an amplifier 300, according to an embodiment. The amplifier 300, in one example, is a low noise amplifier. The amplifier 300 includes a first transistor 302 and a second transistor 304. The first transistor 302 receives a first input INP 306, and the second transistor 304 receives a second input INM 310.

The first transistor 302 is an NPN transistor whose base terminal 302b receives the first input INP 306, and whose emitter terminal 302e is coupled to a first biasing current source IP 322. A collector terminal 302c of the first transistor 302 is coupled to a first current buffer 352. The first biasing current source IP 322 is coupled between the emitter terminal 302e of the first transistor 302 and a ground terminal 326.

The second transistor 304 is an NPN transistor whose base terminal 304b receives the second input INM 310 and whose emitter terminal 304e is coupled to a second biasing current source IM 324. A collector terminal 304c of the second transistor 304 is coupled to a second current buffer 356. The second biasing current source IM 324 is coupled between the emitter terminal 304e of the second transistor 304 and the ground terminal 326. In one version, the first transistor 302 and the second transistor 304 are MOS transistors.

A first output node O1 is coupled to a power supply Vdd 320 through a first load resistor RL1 316. A second output node O2 is coupled to the power supply Vdd 320 through a second load resistor RL2 318. A first output OUTM 312 is generated at the first output node O1, and a second output OUTP 314 is generated at the second output node O2. An impedance Rs 309 is coupled between the emitter terminal 302e of the first transistor 302 and the emitter terminal 304e of the second transistor 304. In one example, a resistance of the first load resistor RL1 316 and the second load resistor RL2 318 are equal.

The first current buffer 352 is coupled between the first output node O1 and the first transistor 302. The first current buffer 352 is a BJT cascode transistor whose base terminal is coupled to a first bias voltage Vb1 354. A collector terminal of the first current buffer 352 is coupled to the first output node O1, and an emitter terminal of the first current buffer 352 is coupled to the collector terminal 302c of the first transistor 302.

The second current buffer 356 is coupled between the second output node O2 and the second transistor 304. The second current buffer 356 is a BJT cascode transistor whose base terminal is coupled to a second bias voltage Vb2 358. A collector terminal of the second current buffer 356 is coupled to the second output node O2, and an emitter terminal of the second current buffer 356 is coupled to the collector terminal 304c of the second transistor 304. In one example, the first bias voltage Vb1 354 is equal to the second bias voltage Vb2 358.

In one example, the BJT cascode transistor is a combination of one or more BJT transistors arranged in cascode structure. In another example, multiple first current buffers are provided between the first output node O1 and the first transistor 302. Similarly, multiple second current buffers are provided between the second output node O2 and the second transistor 304. In yet another example, the first current buffer 352 and the second current buffer 356 are MOS cascode transistors. It is understood that one or more combination of the above examples are well within the scope of this disclosure.

The amplifier 300 includes a filter network 308. In one example, the amplifier 300 includes a plurality of filter networks similar to the filter network 308 in connection and operation. The filter network 308 includes a first capacitor network 332, a primary switch PS 334 and a second capacitor network 336. The first capacitor network 332 is coupled to the first output node O1. The first capacitor network 332 is coupled in parallel to the first current buffer 352. The first capacitor network 332 includes a first capacitor C1 342 and a first switch S1 344. The first capacitor C1 342 is coupled to the first output node O1. The first switch S1 344 is coupled between the first capacitor C1 342 and the emitter terminal of the first current buffer 352.

The second capacitor network 336 is coupled to the second output node O2. The second capacitor network 336 is coupled in parallel to the second current buffer 356. The second capacitor network 336 includes a second capacitor C2 346 and a second switch S2 348. The second capacitor C2 346 is coupled to the second output node O2. The second switch S2 348 is coupled between the second capacitor C2 346 and the emitter terminal of the second current buffer 356. In one example, a capacitance of the first capacitor C1 342 and the second capacitor C2 346 are equal.

The primary switch PS 334 is coupled between the first switch S1 344 in the first capacitor network 332 and the second switch S2 348 in the second capacitor network 336. The amplifier 300 further includes a first fixed capacitor CA1 362 and a second fixed capacitor CA2 364. The first fixed capacitor CA1 362 is coupled between the first output node O1 and the ground terminal 326. The second fixed capacitor CA2 364 is coupled between the second output node O2 and the ground terminal 326. The amplifier 300 may include one or more additional components known to those skilled in the relevant art and are not discussed here for simplicity of the description.

The first load resistor RL1 316, the second load resistor RL2 318, the first fixed capacitor CA1 362, the second fixed capacitor CA2 364 together with the filter network 308 form an I2V (current to voltage) architecture of the amplifier 300. The first transistor 302, the second transistor 304 and the impedance Rs 309 form a V2I (voltage to current) architecture.

A bandwidth of the amplifier 300 is inversely proportional to a product of a resistance of the first load resistor RL1 316 and an effective capacitance. The effective capacitance is measured from a capacitance of the filter network 308 and a capacitance of the first fixed capacitor CA1 362 and the second fixed capacitor CA2 364. The capacitance of the filter network 308 is a function of the first capacitor C1 342 and the second capacitor C2 346. The bandwidth programmability of the amplifier 300 is incorporated into the I2V architecture, and it is programmed by changing the effective capacitance.

The operation of the amplifier 300 illustrated in FIG. 3 is explained now. In one example, the first input INP 306 and the second input INM 310 are biased to a common voltage. The amplifier 300 is capable of single ended operation and differential operation. During the single ended operation, the first input INP 306 is greater than the second input INM 310. For example, the first input INP 306 is at a defined voltage level above common mode voltage, and the second input INM 310 is at common mode voltage. During the differential operation, the first input INP 306 and the second input INM 310 are differential signals. For example, the first input INP 306 is at V/2 and the second input INM 310 is at −V/2, where V is a voltage level.

Each of the first switch S1 344, the primary switch PS 334 and the second switch S2 348 is a MOS transistor. When activated, each of these switches has an ON switch resistance (Rsw). Each of these switches has an associated switch capacitance (Csw). A swing in a voltage across the filter network 308 causes variations in the ON switch resistance (Rsw) and switch capacitance (Csw). This variation in the ON switch resistance (Rsw) results in a distorted voltage across the switch. For example, when the switch is a MOS transistor, a swing across the switch is at least one of swing across source-drain terminal, swing across gate-source terminal and swing across gate-drain terminal. A linearity degradation of a switch due to variation of the ON switch resistance (Rsw) causes much more distortion than the variation of the switch capacitance (Csw) at low frequencies.

During the differential operation, the first input INP 306 is at V/2 and the second input INM 310 is at −V/2, where V is a voltage level. In differential operation, when the primary switch PS 334 is activated, the first switch S1 344 and the second switch S2 348 are inactivated. As a result, no swing exists across the first switch S1 344 and the second switch S2 348, and hence no swing exists across the primary switch PS 334. This does not cause the ON switch resistance (Rsw) and switch capacitance (Csw) non-linearites. Also, the primary switch PS 334 does not require bootstrapping.

In differential operation, when the primary switch PS 334 is inactivated, the first switch S1 344 and the second switch S2 348 are activated. The first capacitor network 332 draws a first capacitive current from the first output node O1, and the second capacitor network 336 draws a second capacitive current from the second output node O2. The first capacitive current flows through the first capacitor C1 342 and the first switch S1 344. The second capacitive current flows through the second capacitor C2 346 and the second switch S2 348.

The first transistor 302 generates a first load current. The first load resistor RL1 316 receives the first load current from the first transistor 302. A current through the first current buffer 352 is a summation of the first load current and the first capacitive current. The second transistor 304 generates a second load current. The second load resistor RL2 318 receives the second load current from the second transistor 304. A current through the second current buffer 356 is a summation of the second load current and the second capacitive current.

Thus, the first capacitor network 332 draws no current from the first output node O1. The first capacitive current flows from the first output node O1, the first capacitor network 332 and the first current buffer 352 and back to the first output node O1. Thus, a current drawn by the first capacitor network 332 from the first output node O1 is returned back to the first output node O1. Similarly, the second capacitor network 336 draws no current from the second output node O2. The second capacitive current flows from the second output node O2, the second capacitor network 336 and the second current buffer 356 and back to the second output node O2. Thus, a current drawn by the second capacitor network 336 from the second output node O2 is returned back to the second output node O2

As a result, no swing exists across the first switch S1 344 and the second switch S2 348, and hence no swing exists across the primary switch PS 334. Therefore, no ON switch resistance (Rsw) and switch capacitance (Csw) non-linearites exist in the amplifier 300 when the primary switch PS 334 is inactivated. Also, none of the switches in the amplifier 300 require bootstrapping because of low voltage swings across the first output node O1 and the second output node O2. In addition, since no large resistors are used for biasing in the amplifier 300, there are no slow settling components.

In one version, a capacitance of the first capacitor C1 342 and the second capacitor C2 346 are equal, a resistance of the first load resistor RL1 316 and the second load resistor RL2 318 are equal, and a capacitance of the first fixed capacitor CA1 362 and the second fixed capacitor CA2 364 are equal. The primary switch PS 334 is inactivated, the first switch S1 344 and the second switch S2 348 are activated. A maximum bandwidth (BW) of the amplifier 300 in this version is given as $$BW = \frac{g}{CA1} \quad (1)$$

where g is conductance of the first load resistor RL1 (g=1/RL1). An input impedance (Zin) of the filter network 308 at the first output node O1 is defined as $$Zin = \frac{(gm + sC1 + sCp)}{(g * gm + gm * sCA1 + g *} \\ (sC1 + sCp) + sC1 * sCp + sCA1 * (sCp + sC1)) \quad (2)$$

where, Cp is parasitic capacitance associated with the first capacitor network 332, and gm is transconductance of the first current buffer 352. When gm>>g, and Cp is approximately equal to zero, the input impedance is defined as:

$$Zin = \frac{RL1}{(1 + sCA1 * RL1)} \quad (3)$$

There is no high time constant in the amplifier 300. Also, no swing exists across any switch in the amplifier 300, and hence linearity is much better as compared to amplifier 100. Thus, the amplifier 300 is very effective both when the primary switch PS 334 is activated and when the primary switch PS 334 is inactivated.

FIG. 4 illustrates an amplifier 400, according to an embodiment. The amplifier 400, in one example, is a low noise amplifier. The amplifier 400 includes a first transistor 402 and a second transistor 404. The first transistor 402 receives a first input INP 406, and the second transistor 404 receives a second input INM 410.

The first transistor 402 is an NPN transistor whose base terminal 402b receives the first input INP 406, and whose emitter terminal 402e is coupled to a first biasing current source IP 422. A collector terminal 402c of the first transistor 402 is coupled to a first current buffer 452. The first biasing current source IP 422 is coupled between the emitter terminal 402e of the first transistor 402 and a ground terminal 426.

The second transistor 404 is an NPN transistor whose base terminal 404b receives the second input INM 410 and whose emitter terminal 404e is coupled to a second biasing current source IM 424. A collector terminal 404c of the second transistor 404 is coupled to a second current buffer 456. The second biasing current source IM 424 is coupled between the emitter terminal 404e of the second transistor 404 and the ground terminal 426. In one version, the first transistor 402 and the second transistor 404 are MOS transistors.

A first output node O1 is coupled to a power supply Vdd 420 through a first load resistor RL1 416. A second output node O2 is coupled to the power supply Vdd 420 through a second load resistor RL2 418. A first output OUTM 412 is generated at the first output node O1, and a second output OUTP 414 is generated at the second output node O2. An impedance Rs 409 is coupled between the emitter terminal 402e of the first transistor 402 and the emitter terminal 404e of the second transistor 404. In one example, a resistance of the first load resistor RL1 416 and the second load resistor RL2 418 are equal.

The first current buffer 452 is coupled between the first output node O1 and the first transistor 402. The first current buffer 452 is a BJT cascode transistor whose base terminal is coupled to a first bias voltage Vb1 454. A collector terminal of the first current buffer 452 is coupled to the first output node O1, and an emitter terminal of the first current buffer 452 is coupled to the collector terminal 402c of the first transistor 402.

The second current buffer 456 is coupled between the second output node O2 and the second transistor 404. The second current buffer 456 is a BJT cascode transistor whose base terminal is coupled to a second bias voltage Vb2 458. A collector terminal of the second current buffer 456 is coupled to the second output node O2, and an emitter terminal of the second current buffer 456 is coupled to the collector terminal 404c of the second transistor 404. In one example, the first bias voltage Vb1 454 is equal to the second bias voltage Vb2 458.

In one example, the BJT cascode transistor is a combination of one or more BJT transistors arranged in cascode structure. In another example, multiple first current buffers are provided between the first output node O1 and the first transistor 402. Similarly, multiple second current buffers are provided between the second output node O2 and the second transistor 404. In yet another example, the first current buffer 452 and the second current buffer 456 are MOS cascode transistors. It is understood that one or more combination of the above examples are well within the scope of this disclosure.

The amplifier 400 includes a filter network 408. In one example, the amplifier 400 includes a plurality of filter networks similar to the filter network 408 in connection and operation. The filter network 408 includes a first capacitor network 432, a first primary switch PS1 434, a second primary switch PS2 438 and a second capacitor network 436. The first capacitor network 432 is coupled to the first output node O1. The first capacitor network 432 is coupled in parallel to the first current buffer 452. The first capacitor network 432 includes a first capacitor C1 442, a third capacitor 2C1 443, a first switch S1 444 and a third switch S3 445. The first capacitor C1 442 and the third capacitor 2C1 443 are coupled to the first output node O1. The first switch S1 444 is coupled between the first capacitor C1 442 and the emitter terminal of the first current buffer 452. The third switch S3 445 is coupled between the third capacitor 2C1 443 and the emitter terminal of the first current buffer 452. A capacitance of the third capacitor 2C1 443 is twice a capacitance of the first capacitor C1 442. In one version, the capacitance of the third capacitor 2C1 443 is a multiple of a capacitance of the first capacitor C1 442.

The second capacitor network 436 is coupled to the second output node O2. The second capacitor network 436 is coupled in parallel to the second current buffer 456. The second capacitor network 436 includes a second capacitor C2 446, a fourth capacitor 2C2 447, a second switch S2 448 and a fourth switch S4 449. The second capacitor C2 446 and the fourth capacitor 2C2 447 are coupled to the second output node O2. The second switch S2 448 is coupled between the second capacitor C2 446 and the emitter terminal of the second current buffer 456. The fourth switch S4 449 is coupled between the fourth capacitor 2C2 447 and the emitter terminal of the second current buffer 456. A capacitance of the fourth capacitor 2C2 447 is twice a capacitance of the second capacitor C2 446. In one version, the capacitance of the fourth capacitor 2C2 447 is a multiple of a capacitance of the second capacitor C2 446. In one example, a capacitance of the first capacitor C1 442 and the second capacitor C2 446 are equal.

The first primary switch PS1 434 is coupled between the first switch S1 444 and the second switch S2 448. The second primary switch PS2 438 is coupled between the third switch S3 445 and the fourth switch S4 449. The amplifier 400 further includes a first fixed capacitor CA1 462 and a second fixed capacitor CA2 464. The first fixed capacitor CA1 462 is coupled between the first output node O1 and the ground terminal 426. The second fixed capacitor CA2 464 is coupled between the second output node O2 and the ground terminal 426. The amplifier 400 may include one or more additional components known to those skilled in the relevant art and are not discussed here for simplicity of the description.

The first load resistor RL1 416, the second load resistor RL2 418, the first fixed capacitor CA1 462, the second fixed capacitor CA2 464 together with the filter network 408 form an I2V (current to voltage) architecture of the amplifier 400. The first transistor 402, the second transistor 404 and the impedance Rs 409 form a V2I (voltage to current) architecture.

A bandwidth of the amplifier 400 is inversely proportional to a product of a resistance of the first load resistor RL1 416 and an effective capacitance. The effective capacitance is measured from a capacitance of the filter network 408 and a capacitance of the first fixed capacitor CA1 462 and the second fixed capacitor CA2 464. The capacitance of the filter network 408 is a function of the first capacitor C1 442, the second capacitor C2 446, the third capacitor 2C1 443 and the fourth capacitor 2C2 447. The bandwidth programmability of the amplifier 400 is incorporated into the I2V architecture, and it is programmed by changing the effective capacitance.

The operation of the amplifier 400 illustrated in FIG. 4 is explained now. In one example, the first input INP 406 and the second input INM 410 are biased to a common voltage. The amplifier 400 is capable of single ended operation and differential operation. During the single ended operation, the first input INP 406 is greater than the second input INM 410. For example, the first input INP 406 is at a defined voltage level above common mode voltage, and the second input INM 410 is at common mode voltage. During the differential operation, the first input INP 406 and the second input INM 410 are differential signals. For example, the first input INP 406 is at V/2 and the second input INM 410 is at −V/2, where V is a voltage level.

Each of the first switch S1 444, the first primary switch PS1 434, the second switch S2 448, the third switch S3 445, the second primary switch PS2 438 and the fourth switch S4 449 is a MOS transistor. When activated, each of these switches has an ON switch resistance (Rsw). Each of these switches has an associated switch capacitance (Csw). A swing in a voltage across the filter network 408 causes variations in the ON switch resistance (Rsw) and switch capacitance (Csw). This variation in the ON switch resistance (Rsw) results in a distorted voltage across the switch. For example, when the switch is a MOS transistor, a swing across the switch is at least one of swing across source-drain terminal, swing across gate-source terminal and swing across gate-drain terminal. A linearity degradation of a switch due to variation of the ON switch resistance (Rsw) is much more dominant than the variation of the switch capacitance (Csw) at low frequencies.

During the differential operation, the first input INP 406 is at V/2 and the second input INM 410 is at −V/2, where V is a voltage level. In differential operation, when both the first primary switch PS1 434 and the second primary switch PS2 438 are activated, the first switch S1 444, the second switch S2 448, the third switch S3 445 and the fourth switch S4 449 are inactivated. This does not cause the ON switch resistance (Rsw) and switch capacitance (Csw) non-linearites. Also, the first primary switch PS1 434 and the second primary switch PS2 438 does not require bootstrapping.

In differential operation, when the first primary switch PS1 434 and the second primary switch PS2 438 are inactivated, the first switch S1 444, the second switch S2 448, the third switch S3 445 and the fourth switch S4 449 are activated. The first capacitor network 432 draws a first capacitive current from the first output node O1, and the second capacitor network 436 draws a second capacitive current from the second output node O2.

The first transistor 402 generates a first load current. The first load resistor RL1 416 receives the first load current from the first transistor 402. A current through the first current buffer 452 is a summation of the first load current and the first capacitive current. The second transistor 404 generates a second load current. The second load resistor RL2 418 receives the second load current from the second transistor 404. A current through the second current buffer 456 is a summation of the second load current and the second capacitive current.

Thus, the first capacitor network 432 draws current from the first output node O1. The first capacitive current flows from the first output node O1, the first capacitor network 432 and the first current buffer 452 and back to the first output node O1. Thus, a current drawn by the first capacitor network 432 from the first output node O1 is returned back to the first output node O1. Similarly, the second capacitor network 436 draws current from the second output node O2. The second capacitive current flows from the second output node O2, the second capacitor network 436 and the second current buffer 456 and back to the second output node O2. Thus, a current drawn by the second capacitor network 436 from the second output node O2 is returned back to the second output node O2.

As a result, no swing exists across the first switch S1 444 and the second switch S2 448, and hence no swing exists across the primary switch PS1 434. Therefore, no ON switch resistance (Rsw) and switch capacitance (Csw) non-linearites exist in the amplifier 400 when the first primary switch PS1 434 and the second primary switch PS2 438 are inactivated. Also, none of the switches in the amplifier 400 require bootstrapping because of low voltage swings across all switches in the amplifier 400. In addition, since no large resistors are used for biasing in the amplifier 400, there are no slow settling components.

In one version, a capacitance of the first capacitor C1 442 and the second capacitor C2 446 are equal. Thus, a capacitance of each of the first capacitor C1 442 and the second capacitor C2 446 is C. A capacitance of each of the third capacitor 2C1 443 and the fourth capacitor 2C2 447 is 2 C. An effective capacitance at the first output node O1 and the second output node O2 is explained in Table 1 in different scenarios.

TABLE 1

| S1 & S2 | S3 & S4 | PS1 | PS2 | Capacitance at O1 & O2 |
|---|---|---|---|---|
| Activated | Activated | Inactivated | Inactivated | CA1 |
| Inactivated | Activated | Activated | Inactivated | CA1 + C |
| Activated | Inactivated | Inactivated | Activated | CA1 + 2C |
| Inactivated | Inactivated | Activated | Activated | CA1 + 3C |

Thus, a range of the effective capacitance at the first output node O1 varies from 0 to 3 C with a step function of C.

FIG. 5 illustrates an amplifier 500, according to an embodiment. The amplifier 500, in one example, is a low noise amplifier. The amplifier 500 includes a first transistor 502 and a second transistor 504. The first transistor 502 receives a first input INP 506, and the second transistor 504 receives a second input INM 510.

The first transistor 502 is an NPN transistor whose base terminal 502b receives the first input INP 506, and whose emitter terminal 502e is coupled to a first biasing current source IP 522. A collector terminal 502c of the first transistor 502 is coupled to a first current buffer 552. The first biasing current source IP 522 is coupled between the emitter terminal 502e of the first transistor 502 and a ground terminal 526.

The second transistor 504 is an NPN transistor whose base terminal 504b receives the second input INM 510 and whose emitter terminal 504e is coupled to a second biasing current source IM 524. A collector terminal 504c of the second transistor 504 is coupled to a second current buffer 556. The second biasing current source IM 524 is coupled between the emitter terminal 504e of the second transistor 504 and the ground terminal 526. In one version, the first transistor 502 and the second transistor 504 are MOS transistors.

A first output node O1 is coupled to a power supply Vdd 520 through a first load resistor RL1 516. A second output node O2 is coupled to the power supply Vdd 520 through a second load resistor RL2 518. A first output OUTM 512 is generated at the first output node O1, and a second output OUTP 514 is generated at the second output node O2. An impedance Rs 509 is coupled between the emitter terminal 502e of the first transistor 502 and the emitter terminal 504e of the second transistor 504. In one example, a resistance of the first load resistor RL1 516 and the second load resistor RL2 518 are equal.

The first current buffer 552 is coupled between the first output node O1 and the first transistor 502. The first current buffer 552 is a BJT cascode transistor whose base terminal is coupled to a first bias voltage Vb1 554. A collector terminal of the first current buffer 552 is coupled to the first output node O1, and an emitter terminal of the first current buffer 552 is coupled to the collector terminal 502c of the first transistor 502.

The second current buffer 556 is coupled between the second output node O2 and the second transistor 504. The second current buffer 556 is a BJT cascode transistor whose base terminal is coupled to a second bias voltage Vb2 558. A collector terminal of the second current buffer 556 is coupled to the second output node O2, and an emitter terminal of the second current buffer 556 is coupled to the collector terminal 504c of the second transistor 504. In one example, the first bias voltage Vb1 554 is equal to the second bias voltage Vb2 558.

In one example, the BJT cascode transistor is a combination of one or more BJT transistors arranged in cascode structure. In another example, multiple first current buffers are provided between the first output node O1 and the first transistor 502. Similarly, multiple second current buffers are provided between the second output node O2 and the second transistor 504. In yet another example, the first current buffer 552 and the second current buffer 556 are MOS cascode transistors. It is understood that one or more combination of the above examples are well within the scope of this disclosure.

The amplifier 500 includes a filter network 508. In one example, the amplifier 500 includes a plurality of filter networks similar to the filter network 508 in connection and operation. The filter network 508 includes a first capacitor network, a primary switch PS 534 and a second capacitor network. The first capacitor network is coupled to the first output node O1. The first capacitor network includes a first capacitor C1 542 and a first switch S1 544. The first capacitor C1 542 is coupled to the first output node O1. The first switch S1 544 is coupled between the first capacitor C1 542 and the emitter terminal of the second current buffer 556.

The second capacitor network is coupled to the second output node O2. The second capacitor network includes a second capacitor C2 546 and a second switch S2 548. The second capacitor C2 546 is coupled to the second output node O2. The second switch S2 548 is coupled between the second capacitor C2 546 and the emitter terminal of the first current buffer 552. In one example, a capacitance of the first capacitor C1 542 and the second capacitor C2 546 are equal.

The primary switch PS 534 is coupled between the first switch S1 544 in the first capacitor network and the second switch S2 548 in the second capacitor network. The amplifier 500 further includes a first fixed capacitor CA1 562 and a second fixed capacitor CA2 564. The first fixed capacitor CA1 562 is coupled between the first output node O1 and the ground terminal 526. The second fixed capacitor CA2 564 is coupled between the second output node O2 and the ground terminal 526. The amplifier 500 may include one or more additional components known to those skilled in the relevant art and are not discussed here for simplicity of the description.

The first load resistor RL1 516, the second load resistor RL2 518, the first fixed capacitor CA1 562, the second fixed capacitor CA2 564 together with the filter network 508 form an I2V (current to voltage) architecture of the amplifier 500. The first transistor 502, the second transistor 504 and the impedance Rs 509 form a V2I (voltage to current) architecture.

A bandwidth of the amplifier 500 is inversely proportional to a product of resistance of the first load resistor RL1 516 and an effective capacitance. The effective capacitance is measured from a capacitance of the filter network 508 and a capacitance of the first fixed capacitor CA1 562 and the second fixed capacitor CA2 564. The bandwidth programmability of the amplifier 500 is incorporated into the I2V architecture, and it is programmed by changing the effective capacitance.

The operation of the amplifier 500 illustrated in FIG. 5 is explained now. In one example, the first input INP 506 and the second input INM 510 are biased to a common voltage. The amplifier 500 is capable of single ended operation and differential operation. During the single ended operation, the first input INP 506 is greater than the second input INM 510. For example, the first input INP 506 is at a defined voltage level above common mode voltage, and the second input INM 510 is at common mode voltage. During the differential operation, the first input INP 506 and the second input INM 510 are differential signals. For example, the first input INP 506 is at V/2 and the second input INM 510 is at −V/2, where V is a voltage level.

Each of the first switch S1 544, the primary switch PS 534 and the second switch S2 548 is a MOS transistor. When activated, each of these switches has an ON switch resistance (Rsw). Each of these switches has an associated switch capacitance (Csw). A swing in a voltage across the filter network 508 causes variations in the ON switch resistance (Rsw) and switch capacitance (Csw). This variation in the ON switch resistance (Rsw) results in a distorted voltage across the switch. For example, when the switch is a MOS transistor, a swing across the switch is at least one of swing across source-drain terminal, swing across gate-source terminal and swing across gate-drain terminal. A linearity degradation of a switch due to variation of the ON switch resistance (Rsw) is much more dominant than the variation of the switch capacitance (Csw) at low frequencies.

During the differential operation, the first input INP 506 is at V/2 and the second input INM 510 is at −V/2, where V is a voltage level. In differential operation, when the primary switch PS 534 is activated, the first switch S1 544 and the second switch S2 548 are inactivated. As a result, no swing exists across the first switch S1 544, the second switch S2 548 and the primary switch PS 534. This does not cause the ON switch resistance (Rsw) and switch capacitance (Csw) non-linearites. Also, the primary switch PS 534 does not require bootstrapping.

In differential operation, when the primary switch PS 534 is inactivated, the first switch S1 544 and the second switch S2 548 are activated. The first capacitor network draws a first capacitive current from the first output node O1, and the second capacitor network draws a second capacitive current from the second output node O2. The first capacitive current flows from the first capacitor C1 542, the first switch S1 544 and second current buffer 556 to reach the second output node O2. The second capacitive current flows from the the second output node O2, the second capacitor C2 546, the second switch S2 548 and the first current buffer 552 to reach the first output node O1. Thus, an effective capacitance of the filter network 508 as seen from the first output node O1 is sum of capacitance of the first capacitor C1 542 and the second capacitor C2 546. The effective capacitance is 2 C when capacitance of each of the first capacitor C1 542 and the second capacitor C2 546 is C. Similarly, the effective capacitance of the filter network 508 as seen from the second output node O2 is also 2C. Hence, in one version, only half the capacitance is required i.e. value of each of the first capacitor C1 542 and the second capacitor C2 546 can be C/2 to have an effective capacitance of C.

The first transistor 502 generates a first load current. A current through the first current buffer 552 is the first load current plus the second capacitive current. The second transistor 504 generates a second load current. A current through the second current buffer 556 is a summation of the second load current and the first capacitive current.

The first capacitive current flows from the first output node O1, the first capacitor network and the second current buffer 556 and to the second output node O2. The second capacitive current flows from the second output node O2, the second capacitor network and the first current buffer 552 and to the first output node O1. A current through the first load resistor RL1 516 is a sum of the first load current from the first transistor 502 and the second capacitive current minus the first capacitive current. Similarly, the second load resistor RL2 518 is a sum of the second load current from the second transistor 504 and the first capacitive current minus the second capacitive current.

As a result, no swing exists across the first switch S1 544 and the second switch S25, and hence no swing exists across the primary switch PS 534. Therefore, no ON switch resistance (Rsw) and switch capacitance (Csw) non-linearites exist in the amplifier 500 when the primary switch PS 534 is inactivated. Also, none of the switches in the amplifier 500 require bootstrapping. In addition, since no large resistors are used for biasing in the amplifier 500, there are no slow settling components.

In one version, a capacitance of the first capacitor C1 542 and the second capacitor C2 546 are equal, a resistance of the first load resistor RL1 516 and the second load resistor RL2 518 are equal, and a capacitance of the first fixed capacitor CA1 562 and the second fixed capacitor CA2 564 are equal. The primary switch PS 534 is inactivated, the first switch S1 544 and the second switch S2 548 are activated. A maximum bandwidth (BW) of the amplifier 500 in this version is given as $$BW = \frac{g}{CA1 + 2C1} \quad (4)$$

where g is conductance of the first load resistor RL1 (g=1/RL1). An input impedance (Zin) of the filter network 508 at the first output node O1 is defined as $$Zin = \frac{(gm + sC1 + sCp)}{(g*gm + gm*(2sC1 + sCA1) + g*(sC1 + sCp) + sC1*sCp + sCA1*(sCp + sC1))} \quad (5)$$

where, Cp is parasitic capacitance associated with the first capacitor network C1 542, and gm is transconductance of the first current buffer 552. When gm>>g, and Cp is approximately equal to zero, the input impedance is defined as:

$$Zin = \frac{RL1}{(1 + sRL1(CA1 + 2C1))} \quad (6)$$

There is no high time constant in the amplifier 500. Also, no swing exists across any switch in the amplifier 500, and hence linearity is much better as compared to amplifier 100. Thus, the amplifier 500 is very effective in differential operation both when the primary switch PS 534 is activated and when the primary switch PS 534 is inactivated.

FIG. 6 illustrates an amplifier 600, according to an embodiment. The amplifier 600, in one example, is a low noise amplifier. The amplifier 600 includes a first transistor 602 and a second transistor 604. The first transistor 602 receives a first input INP 606, and the second transistor 604 receives a second input INM 610.

The first transistor 602 is an NPN transistor whose base terminal 602b receives the first input INP 606, and whose emitter terminal 602e is coupled to a first biasing current source IP 622. A collector terminal 602c of the first transistor 602 is coupled to a first current buffer 652. The first biasing current source IP 622 is coupled between the emitter terminal 602e of the first transistor 602 and a ground terminal 626.

The second transistor 604 is an NPN transistor whose base terminal 604b receives the second input INM 610 and whose emitter terminal 604e is coupled to a second biasing current source IM 624. A collector terminal 604c of the second transistor 604 is coupled to a second current buffer 656. The second biasing current source IM 624 is coupled between the emitter terminal 604e of the second transistor 604 and the ground terminal 626. In one version, the first transistor 602 and the second transistor 604 are MOS transistors.

A first output node O1 is coupled to a power supply Vdd 620 through a first load resistor RL1 616. A second output node O2 is coupled to the power supply Vdd 620 through a second load resistor RL2 618. A first output OUTM 612 is generated at the first output node O1, and a second output OUTP 614 is generated at the second output node O2. An impedance Rs 609 is coupled between the emitter terminal 602e of the first transistor 602 and the emitter terminal 604e of the second transistor 604. In one example, a resistance of the first load resistor RL1 616 and the second load resistor RL2 618 are equal.

The first current buffer 652 is coupled between the first output node O1 and the first transistor 602. The first current buffer 652 is a BJT cascode transistor whose base terminal is coupled to a first bias voltage Vb1 654. A collector terminal of the first current buffer 652 is coupled to the first output node O1, and an emitter terminal of the first current buffer 652 is coupled to the collector terminal 602c of the first transistor 602.

The second current buffer 656 is coupled between the second output node O2 and the second transistor 604. The second current buffer 656 is a BJT cascode transistor whose base terminal is coupled to a second bias voltage Vb2 658. A collector terminal of the second current buffer 656 is coupled to the second output node O2, and an emitter terminal of the second current buffer 656 is coupled to the collector terminal 604c of the second transistor 604. In one example, the first bias voltage Vb1 654 is equal to the second bias voltage Vb2 658.

In one example, the BJT cascode transistor is a combination of one or more BJT transistors arranged in cascode structure. In another example, multiple first current buffers are provided between the first output node O1 and the first transistor 602. Similarly, multiple second current buffers are provided between the second output node O2 and the second transistor 604. In yet another example, the first current buffer 652 and the second current buffer 656 are MOS cascode transistors. It is understood that one or more combination of the above examples are well within the scope of this disclosure.

The amplifier 600 includes a filter network 608. In one example, the amplifier 600 includes a plurality of filter networks similar to the filter network 608 in connection and operation. The filter network 608 includes a first capacitor network, a first primary switch PS1 634, a second primary switch PS2 638 and a second capacitor network. The first capacitor network is coupled to the first output node O1. The first capacitor network includes a first capacitor C1 642, a third capacitor 2C1 643, a first switch S1 644 and a third switch S3 645. The first capacitor C1 642 and the third capacitor 2C1 643 are coupled to the first output node O1. The first switch S1 644 is coupled between the first capacitor C1 642 and the emitter terminal of the second current buffer 656. The third switch S3 645 is coupled between the third capacitor 2C1 643 and the emitter terminal of the second current buffer 656. A capacitance of the third capacitor 2C1 643 is twice a capacitance of the first capacitor C1 642. In one version, the capacitance of the third capacitor 2C1 643 is a multiple of a capacitance of the first capacitor C1 642.

The second capacitor network is coupled to the second output node O2. The second capacitor network includes a second capacitor C2 646, a fourth capacitor 2C2 647, a second switch S2 648 and a fourth switch S4 649. The second capacitor C2 646 and the fourth capacitor 2C2 647 are coupled to the second output node O2. The second switch S2 648 is coupled between the second capacitor C2 646 and the emitter terminal of the first current buffer 652. The fourth switch S4 649 is coupled between the fourth capacitor 2C2 647 and the emitter terminal of the first current buffer 652. A capacitance of the fourth capacitor 2C2 647 is twice a capacitance of the second capacitor C2 646. In one version, the capacitance of the fourth capacitor 2C2 647 is a multiple of a capacitance of the second capacitor C2 646. In one example, a capacitance of the first capacitor C1 642 and the second capacitor C2 646 are equal.

The first primary switch PS1 634 is coupled between the first switch S1 644 and the second switch S2 648. The second primary switch PS2 638 is coupled between the third switch S3 645 and the fourth switch S4 649. The amplifier 600 further includes a first fixed capacitor CA1 662 and a second fixed capacitor CA2 664. The first fixed capacitor CA1 662 is coupled between the first output node O1 and the ground terminal 626. The second fixed capacitor CA2 664 is coupled between the second output node O2 and the ground terminal 626. The amplifier 600 may include one or more additional components known to those skilled in the relevant art and are not discussed here for simplicity of the description.

The first load resistor RL1 616, the second load resistor RL2 618, the first fixed capacitor CA1 662, the second fixed capacitor CA2 664 together with the filter network 608 form an I2V (current to voltage) architecture of the amplifier 600. The first transistor 602, the second transistor 604 and the impedance Rs 609 form a V2I (voltage to current) architecture.

A bandwidth of the amplifier 600 is inversely proportional to a product of resistance of the first load resistor RL1 616 and an effective capacitance. The effective capacitance is measured from a capacitance of the filter network 608 and a capacitance of the first fixed capacitor CA1 662 and the second fixed capacitor CA2 664. The bandwidth programmability of the amplifier 600 is incorporated into the I2V architecture, and it is programmed by changing the effective capacitance.

The operation of the amplifier 600 illustrated in FIG. 6 is explained now. In one example, the first input INP 606 and the second input INM 610 are biased to a common voltage. The amplifier 600 is capable of single ended operation and differential operation. During the single ended operation, the first input INP 606 is greater than the second input INM 610. For example, the first input INP 606 is at a defined voltage level above common mode voltage, and the second input INM 610 is at common mode voltage. During the differential operation, the first input INP 606 and the second input INM 610 are differential signals. For example, the first input INP 606 is at V/2 and the second input INM 610 is at −V/2, where V is a voltage level.

Each of the first switch S1 644, the first primary switch PS1 634, the second switch S2 648, the third switch S3 645, the second primary switch PS2 638 and the fourth switch S4 649 is a MOS transistor. When activated, each of these switches has an ON switch resistance (Rsw). Each of these switches has an associated switch capacitance (Csw). A swing in a voltage across the filter network 608 causes variations in the ON switch resistance (Rsw) and switch capacitance (Csw). This variation in the ON switch resistance (Rsw) results in a distorted voltage across the switch. For example, when the switch is a MOS transistor, a swing across the switch is at least one of swing across source-drain terminal, swing across gate-source terminal and swing across gate-drain terminal. A linearity degradation of a switch due to variation of the ON switch resistance (Rsw) is much more dominant than the variation of the switch capacitance (Csw) at low frequencies.

During the differential operation, the first input INP 606 is at V/2 and the second input INM 610 is at −V/2, where V is a voltage level. In differential operation, when both the first primary switch PS1 634 and the second primary switch PS2 638 are activated, the first switch S1 644, the second switch S2 648, the third switch S3 645 and the fourth switch S4 649 are inactivated. As a result, no swing exists across the first primary switch PS1 634 and the second primary switch PS2 638. This does not cause the ON switch resistance (Rsw) and switch capacitance (Csw) non-linearites. Also, the first primary switch PS1 634 and the second primary switch PS2 638 does not require bootstrapping.

In differential operation, when the first primary switch PS1 634 and the second primary switch PS2 638 are inactivated, the first switch S1 644, the second switch S2 648, the third switch S3 665 and the fourth switch S4 649 are activated. The first capacitor network draws a first capacitive current from the first output node O1, and the second capacitor network draws a second capacitive current from the first output node O1.

Thus, an effective capacitance of the filter network 608 as seen from the first output node O1 is a sum of capacitance of the first capacitor C1 642, the third capacitor 2C1 643, the second capacitor C2 646, and the fourth capacitor 2C2 647. The effective capacitance is 6 C when capacitance of the first capacitor C1 642, the second capacitor C2 646 is C, and capacitance of the third capacitor 2C 1 643 and the fourth capacitor 2C2 647 is 2 C. Similarly, the effective capacitance of the filter network 608 as seen from the second output node O2 is also 6C.

The first transistor 602 generates a first load current. A current through the first current buffer 652 is the first load current plus the second capacitive current. The second transistor 604 generates a second load current. A current through the second current buffer 656 is a summation of the second load current and the first capacitive current.

The first capacitive current flows from the first output node O1, the first capacitor network, the second current buffer 656 and to the second output node O2. The second capacitive current flows from the second output node O2, the second capacitor network, the first current buffer 652 and to the first output node O1.

As a result, no swing exists across any switch. Therefore, no ON switch resistance (Rsw) and switch capacitance (Csw) non-linearites exist in the amplifier 600 when the first primary switch PS1 634 and the second primary switch PS2 638 are inactivated. Also, none of the switches in the amplifier 600 require bootstrapping because of low voltage swings across all switches in the amplifier 600. In addition, there are no slow settling components.

In one version, a capacitance of the first capacitor C1 642 and the second capacitor C2 646 are equal. Thus, a capacitance of each of the first capacitor C1 642 and the second capacitor C2 646 is C. A capacitance of each of the third capacitor 2C1 643 and the fourth capacitor 2C2 647 is 2 C.

An effective capacitance at the first output node O1 and the second output node O2 is explained in Table 2 in different scenarios

TABLE 2

| S1 & S2 | S3 & S4 | PS1 | PS2 | Capacitance at O1 & O2 |
|---|---|---|---|---|
| Activated | Activated | Inactivated | Inactivated | CA1 + 6C |
| Inactivated | Activated | Activated | Inactivated | CA1 + 5C |
| Activated | Inactivated | Inactivated | Activated | CA1 + 4C |
| Inactivated | Inactivated | Activated | Activated | CA1 + 3C |

Thus, a range of the effective capacitance at the first output node O1 varies from 6 C to 3 C. It is understood, that by using a combination of filter network 408 (illustrated in FIG. 4) and filter network 608, a range of the effective capacitance varies from 0 to 6 C. Hence, for a given range of capacitance required, only half the capacitors are required. For example, when a capacitance of 6C is required, a combination of the filter network 408 and the filter network 608 require capacitors of effective capacitance 3C.

FIG. 7 is a graph illustrating frequency response of an amplifier, according to an embodiment. The graph illustrates frequency response of the amplifier 100 as line A and of the amplifier 300 as line B. The frequency response of the amplifier 300 is similar to the amplifier 100. However, amplifier 300 has several advantages over amplifier 100. Also, no swing exists across any switches of the amplifier 300.

Also, none of the switches in the amplifier 300 require bootstrapping because of low voltage swings across the first output node O1 and the second output node O2. In one example, a size of the switches used in the amplifier 300 is reduced by more than two times as compared to switches used in the amplifier 100. Thus, the amplifier 300 is very effective both when the primary switch PS 334 is activated and when the primary switch PS 334 is inactivated. In addition, a power consumption of the amplifier 300 is less than the power consumption of the amplifier 100 because no bootstrapping requirement in the amplifier 300.

FIG. 8 is a block diagram illustrating an example receiver 800 in which several aspects of the present invention can be implemented. The receiver 800 includes a receive antenna 802. A low noise amplifier (LNA) 804 is coupled to the receive antenna 802. An IF (intermediate frequency) filter 806 is coupled to the LNA 804. An analog to digital converter (ADC) 808 is coupled to the IF filter 806. A processor 810 is coupled to the ADC 808. The receiver 800 may include one or more additional components known to those skilled in the relevant art and are not discussed here for simplicity of the description.

The operation of the receiver 800 illustrated in FIG. 8 is explained now. The receive antenna 802 receives a signal and generates a first input and a second input. The LNA 804 receives the first input and the second input. The LNA 804 is similar in connection and operation to at least one of the amplifier 300, amplifier 400, amplifier 500 and amplifier 600. In one example, the LNA 804 processes the first input and the second input similar to the amplifier 300 processing the first input INP 306 and the second input INM 310.

The LNA 804 includes current buffers. The current buffers used in the LNA 804 provide low input impedance which eliminates slow settling components. Also, none of the switches in the LNA 804 require bootstrapping because of low voltage swings across all switches. The IF filter 806 generates a filtered non-zero IF signal from a signal received from the LNA 804. The ADC 808 samples the filtered non-zero IF signal to generate a valid data. The processor 810 process the valid data.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

The invention claimed is:

1. The An amplifier comprising:
 a first transistor configured to receive a first input and configured to generate a first load current;
 a first output node coupled to a power supply through a first load resistor, the first load resistor configured to receive the first load current;
 a first capacitor network coupled to the first output node and configured to draw a first capacitive current from the first output node; and
 a first current buffer coupled between the first output node and the first transistor, wherein a current through the first current buffer is a summation of the first load current and the first capacitive current;
 a second transistor configured to receive a second input and configured to generate a second load current;
 a second output node coupled to a power supply through a second load resistor, the second load resistor configured to receive the second load current;
 a second capacitor network coupled to the second output node and configured to draw a second capacitive current from the second output node; and
 a second current buffer coupled between the second output node and the second transistor, wherein a current through the second current buffer is a summation of the second load current and the second capacitive current;
 further comprising a filter network, wherein the filter network comprises:
  the first capacitor network coupled in parallel to the first current buffer;
  the second capacitor network coupled in parallel to the second current buffer; and
  a primary switch coupled between the first capacitor network and the second capacitor network.

2. The amplifier of claim 1, wherein when the primary switch is inactivated:
 the first switch and the second switch are activated;
 the first capacitive current flows through the first capacitor and the first switch; and
 the second capacitive current flows through the second capacitor and the second switch.

3. The amplifier of claim 1 further comprising:
 an impedance coupled between the first transistor and the second transistor;
 a first biasing current source coupled between the first transistor and the ground terminal; and
 a second biasing current source coupled between the second transistor and the ground terminal.

* * * * *